(12) United States Patent
Taniguchi et al.

(10) Patent No.: US 7,459,026 B2
(45) Date of Patent: Dec. 2, 2008

(54) LIGHT IRRADIATION APPARATUS, CRYSTALLIZATION APPARATUS, CRYSTALLIZATION METHOD AND DEVICE

(75) Inventors: Yukio Taniguchi, Yokohama (JP); Masakiyo Matsumura, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 487 days.

(21) Appl. No.: 11/198,185

(22) Filed: Aug. 8, 2005

(65) Prior Publication Data

US 2006/0027762 A1 Feb. 9, 2006

(30) Foreign Application Priority Data

Aug. 9, 2004 (JP) .............................. 2004-232708

(51) Int. Cl.
*C30B 25/12* (2006.01)
(52) U.S. Cl. ........................... 117/92; 117/90; 117/103; 117/904
(58) Field of Classification Search ................... 117/90, 117/92, 103, 904
See application file for complete search history.

(56) References Cited

U.S. PATENT DOCUMENTS

2006/0027762 A1   2/2006   Taniguchi et al.

FOREIGN PATENT DOCUMENTS

| JP | 2004-31841 | 1/2004 |
|---|---|---|
| JP | 2004-72103 | 3/2004 |
| JP | 2006-254236 | * 9/2006 |

OTHER PUBLICATIONS

Masakiyo Matsumura "Preparation of Ultra-Large Grain Silicon Thin-Films by Excimer-Laser", Surface Science, 2000, vol. 21, No. 5, pp. 278-287.
Masayuki Jyumonji, et al. "Arrays of Large Si Grains Grown at Room Temperature for x-Si TFTs", SID International Symposium Digest of Technical Papers, 2004,vol. XXXV, Book I, pp. 434-437.
U.S. Appl. No. 11/198,185, filed Aug. 8, 2005, Taniguchi et al.
U.S. Appl. No. 11/210,863, filed Aug. 25, 2005, Matsumura et al.
U.S. Appl. No. 11/851,739, filed Sep. 7, 2007, Taniguchi.

* cited by examiner

*Primary Examiner*—Felisa C Hiteshew
(74) *Attorney, Agent, or Firm*—Oblon, Spivak, McClelland, Maier & Neustadt, P.C.

(57) ABSTRACT

A light irradiation apparatus includes a light modulation element which has a phase step having a phase difference substantially different from 180°, an illumination optical system which illuminates the light modulation element, and an image formation optical system which forms, on an irradiation surface, a light intensity distribution based on a light beam phase-modulated by the light modulation element. The illumination optical system illuminates the light modulation element with an illumination light beam inclined in a direction normal to a step line of the phase step.

7 Claims, 15 Drawing Sheets

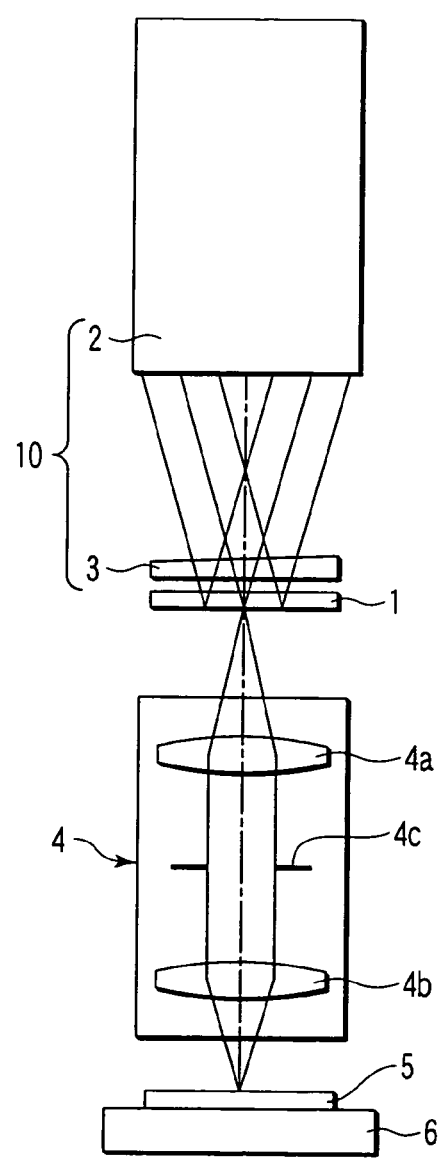
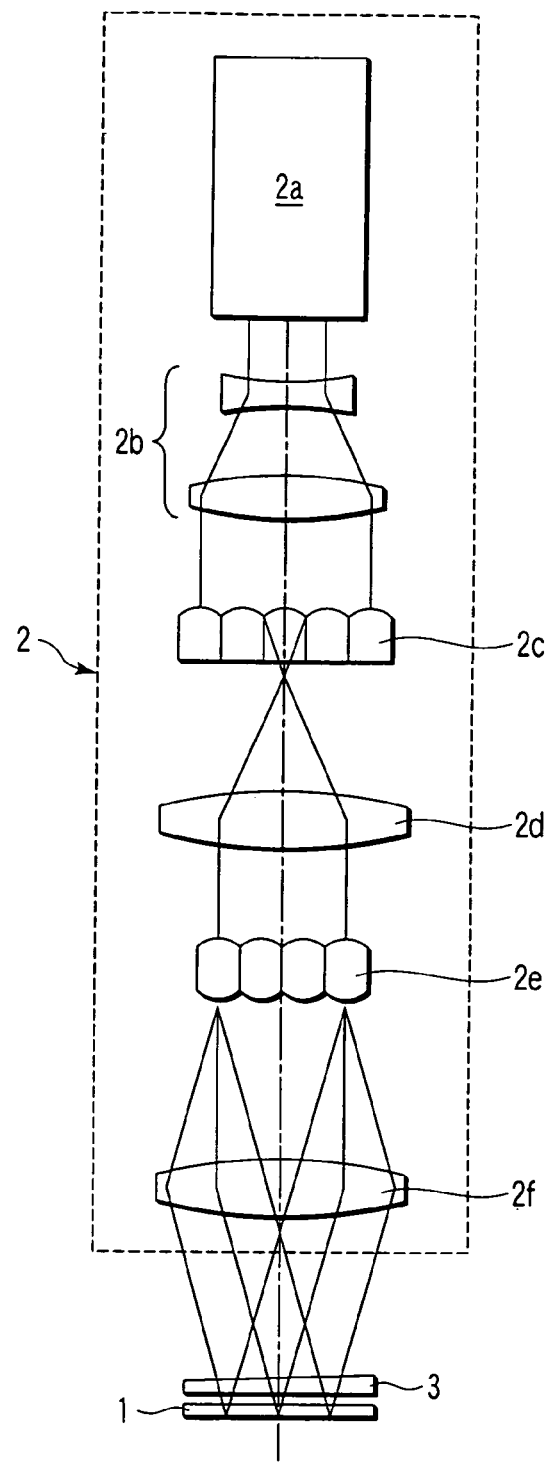
FIG. 1
FIG. 2

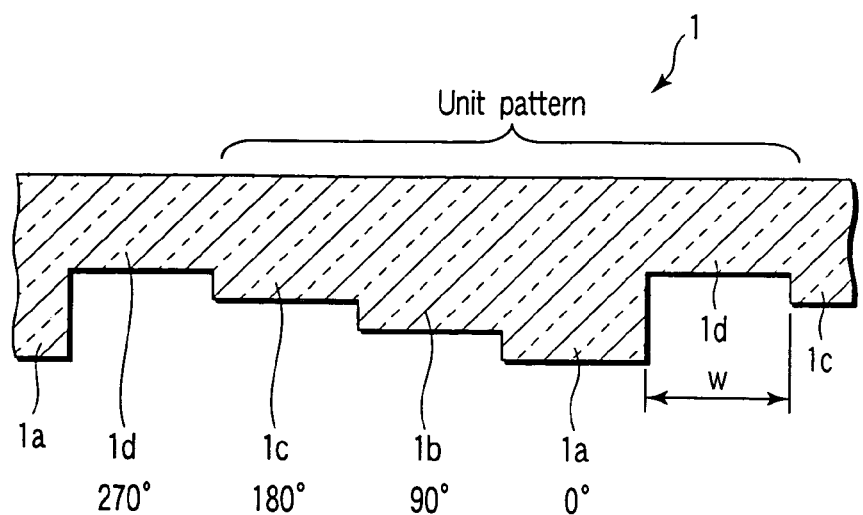
FIG. 3
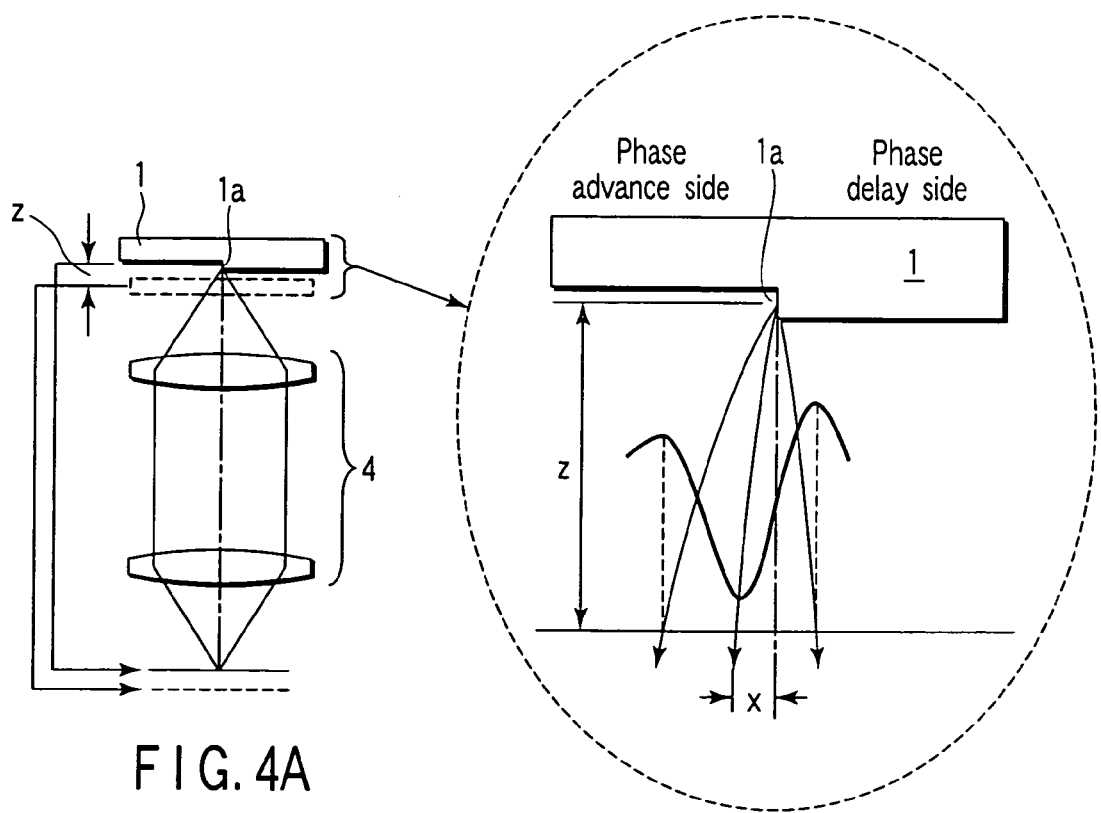
FIG. 4A
FIG. 4B

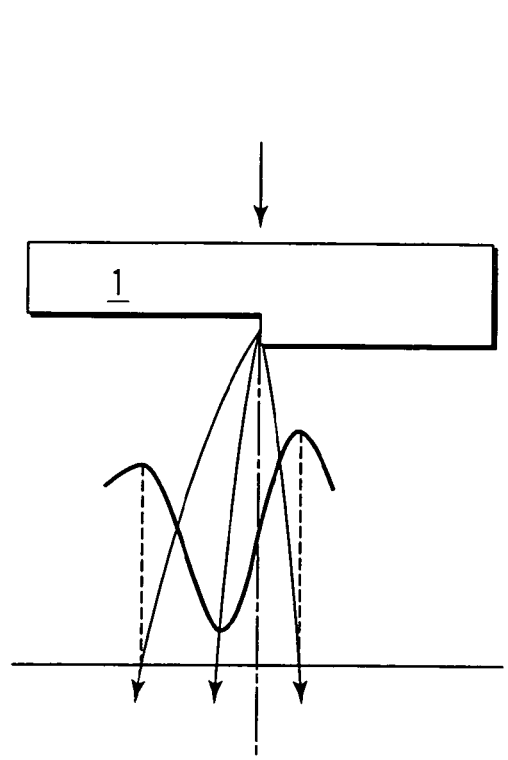
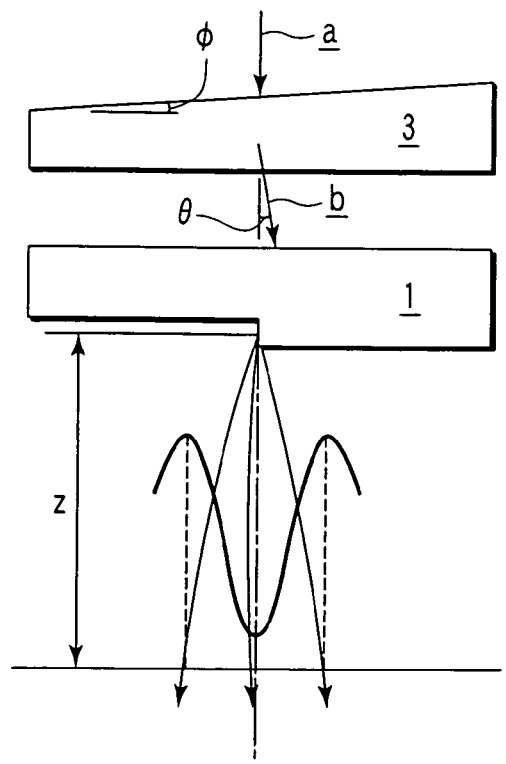
FIG. 6A
RERATED ART
FIG. 6B
RERATED ART
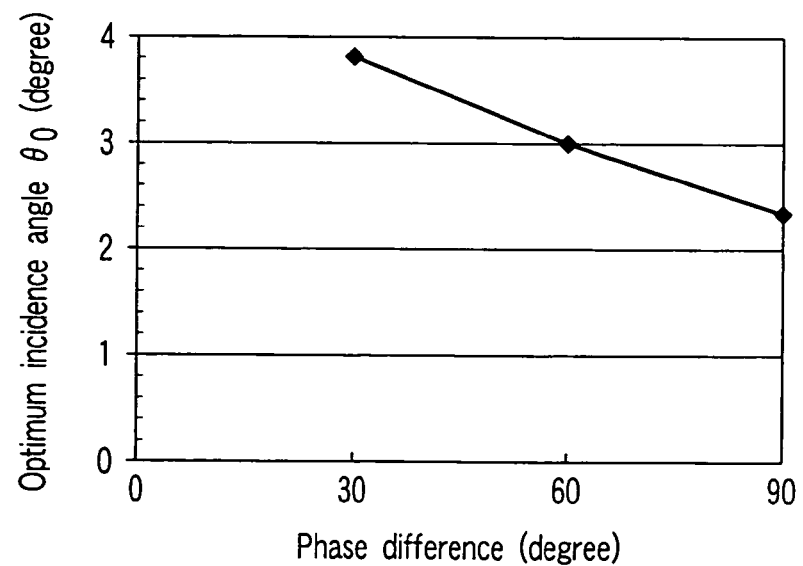
FIG. 7

RERATED ART

RERATED ART

LIGHT IRRADIATION APPARATUS, CRYSTALLIZATION APPARATUS, CRYSTALLIZATION METHOD AND DEVICE

CROSS-REFERENCE TO RELATED APPLICATIONS

This application is based upon and claims the benefit of priority from prior Japanese Patent Application No. 2004-232708, filed Aug. 9, 2004, the entire contents of which are incorporated herein by reference.

BACKGROUND OF THE INVENTION

1. Field of the Invention

The present invention relates to a light irradiation apparatus, a crystallization apparatus, a crystallization method and a device. In particular, the present invention relates to a crystallization apparatus and a crystallization method which generate a crystallized semiconductor film by irradiating a non-single-crystal semiconductor film with a laser light having a predetermined light intensity distribution.

2. Description of the Related Art

A thin film transistor (TFT) used for a switching element or the like which selects a display pixel in, e.g., a liquid crystal display (LCD) has been conventionally formed by using amorphous silicon or polysilicon.

Polysilicon has a higher mobility of electrons or holes than that of amorphous silicon. Therefore, when a transistor is formed by using polysilicon, the switching speed and hence a display response speed become higher than those in the case of forming the same by using amorphous silicon. Further, a peripheral LSI can comprise a thin-film transistor. Furthermore, there is an advantage of reducing the design margin of any other component. Moreover, when peripheral circuits such as a driver circuit or a DAC are incorporated in a display, these peripheral circuits can be operated at higher speed.

Since polysilicon comprises an aggregation of crystal grains, when, e.g., a TFT transistor is formed, a crystal grain boundary or boundaries are present in its channel region, this crystal grain boundary serves as a barrier, and a mobility of electrons or holes is reduced as compared with that of single-crystal silicon. Additionally, each of many thin-film transistors formed by using polysilicon has a different number of crystal grain boundaries formed in its channel portion, and this difference becomes irregularities, resulting in a problem of unevenness in display in case of a liquid crystal display. Thus, there has been recently proposed a crystallization method which generates crystallized silicon with a large particle (grain) size enabling at least one channel region to be formed in order to improve the mobility of electrons or holes and reduce irregularities in number of crystal grain boundaries in a channel portion.

As this type of crystallization method, there has been conventionally known a phase-control excimer laser annealing (ELA) method which forms a crystallized semiconductor film by irradiating a phase shifter approximated in parallel to a non-single-crystal semiconductor film (a polycrystal semiconductor film or an amorphous semiconductor film) with an excimer laser. Details of the phase-control ELA method are disclosed in, e.g., Journal of The Surface Science Society of Japan, Vol. 21, No. 5, pp. 278-287, 2000.

In this phase-control ELA method, a light intensity distribution having an inverse peak pattern (a pattern in which a light intensity is minimum at the center and the light intensity is suddenly increased toward the periphery (lateral sides)) in which the light intensity at a point corresponding to a phase shift portion (line or point) of a phase shifter is lower than that in the periphery is generated, and a non-single-crystal semiconductor film is irradiated with a light beam having this light intensity distribution with the inverse peak shape. As a result, a temperature gradient is generated in a molten area in accordance with the light intensity distribution in an irradiation target area, a crystal nucleus is formed at a part which is solidified first or a part which is not molten in accordance with a point where the light intensity is minimum, and a crystal grows from the crystal nucleus in a lateral direction toward the periphery (which will be referred to as a "lateral growth" hereinafter), thereby generating a single-crystal grain with a large particle size.

Further, "Arrays of Large Si Grains Grown at Room Temperature for x-Si TFTs" by M. Jyumonji, et al., SID 04 Digest, pp. 434, 2004 discloses that positioning of a growth start point of a crystal is performed by irradiating a non-single-crystal semiconductor film with a light beam having a light intensity distribution with an inverse peak shape generated by a phase step of a phase shifter. Further, this reference also describes a technique which optimally adjusts a light intensity at a bottom peak (an inverse peak point) in a light intensity distribution with an inverse peak shape by appropriately setting a phase difference (a phase quantity) of the phase step.

As described above, according to the latter reference, a bottom peak value in a light intensity distribution with an inverse peak shape is determined by a phase difference of the phase step. Specifically, as shown in FIG. 16A, when a phase shifter 191 which has a phase step 191a having a phase difference of 180° is used, a light intensity distribution with an inverse peak shape formed at a focus plane (an image formation surface) of an image formation optical system is symmetrical with respect to a line 191b corresponding to the phase step indicated by a broken line as shown in FIG. 16C, and a light intensity at its bottom peak 192 is substantially zero. Furthermore, a light intensity distribution with an inverse peak shape formed on a defocus plane vertically slightly moved from the focus plane of the image formation optical system is likewise substantially symmetrical as shown in FIGS. 16B and 16D, and a light intensity at its bottom peak 192 slightly increases from zero but is very small.

In this manner, when the phase shifter having the phase difference of 180°, since the symmetry of the light intensity distribution is maintained without being dependent on a defocus direction, a deep depth of focus can be realized. However, since the light intensity at the bottom peak is very small, the light intensity becomes not greater than a crystal growth start intensity (a light intensity with which the crystal growth starts) in an area having a certain degree of superficial content in the vicinity of the bottom peak. As a result, in the vicinity of the bottom peak, an amorphous state remains unchanged or, even if an irradiation target is molten, it remains in a polysilicon or fine crystal state, and hence an area ratio of a target part which becomes a crystal with a large particle size (i.e., a filling ratio of a crystal grain) cannot be increased. Here, the filling ratio is a ratio of a crystallized area with respect to an irradiation surface when a light having a light intensity distribution with an inverse peak shape is applied.

Conversely, as shown in FIG. 17A, when a phase shifter 193 which has a phase step 193a having a phase difference of 60° is used, a light intensity distribution with an inverse peak shape formed on a focus plane of an image formation optical system becomes substantially symmetrical with respect to a virtual line 193b corresponding to the phase step 193a and indicated by a broken line as shown in FIG. 17C and a light intensity at its bottom peak 192 becomes high to some extent. On the contrary, at a defocus position vertically slightly moved from the focus position of the image formation optical system, as shown in FIGS. 17B and 17D, the symmetry of the light intensity distribution with the inverse peak shape to be formed largely collapses, and a position of its bottom peak is shifted (moved). It is to be noted that a board thickness deviation which can be a factor of defocusing unavoidably exists in a processed substrate which is held at the focus position of the image formation optical system.

In this manner, when the phase shifter having the phase difference of 60° is used, the light intensity at the bottom peak becomes high and approximates the crystal growth start intensity as compared with the case of using the phase shifter having the phase difference of 180°, thereby enlarging a crystallized area. However, in case of the phase shifter having the phase difference of 60°, the symmetry of the light intensity distribution largely collapses at the defocus position vertically moved from the focus position. Further, since the way the symmetry collapses is inverted being dependent on the defocus direction between the light intensity distribution shown in FIG. 17B and the light intensity distribution depicted in FIG. 17D, a depth of focus becomes shallow (narrow).

Furthermore, since a position of the bottom peak is shifted in a plane by defocusing, a position of a crystal grain to be generated is also shifted from a desired position, which becomes a problem when forming a circuit by using this crystal grain. That is, when a crystal grain is not formed at a desired position, a boundary or boundaries of crystal grains exist in a channel portion of a transistor, thereby deteriorating characteristics of the transistor. The term "phase" pertaining to the present invention will be defined as follows, with reference to FIG. 18.

Consider the wavefront of an incident plane wave, which lies immediately behind a phase shifter. That part of the wavefront, which shifts in the propagation direction of light, is defined as "phase-advancing" side region. That part of the wavefront, which shifts toward the light source, is defined as "phase-delaying" side region. As FIG. 18 shows, the phase shifter has a protruding or thick part and a depressing or thin part on one surface. These parts border each other at a stepped portion. The protracting or projecting part is at the phase-advancing side region, and the depressing or receding part is at the phase-delaying side region.

This definition of phase can be applied also to other phase shifters that have neither a projecting part or a receding part. The phase may be controlled by using a fine pattern having lower resolution than the focusing optical system used. In this case, it suffices to apply the same definition of phase to the wavefront formed in the imaging field. For any phase shifter, the phase has a positive value if it advances. For example, +90° means a phase advance, and −90° a phase delay.

Moreover, when the phase shifter having the phase difference of 60° is used, as shown in FIGS. 17B and 17D, a peak intensity provided on one side of peaks provided on both sides of a bottom peak is raised an greatly increased in a light intensity distribution with an inverse peak shape at a defocus position. As a result, there is an inconvenience that a semiconductor film is destroyed due to ablation at this peak position on one side. It is to be noted that the side where the peak intensity is increased is a phase delay side (the left side of the phase shifter 193 in the figure) of a phase step at a defocus position apart from an image formation optical system, and it is a phase advance side (the right side of the phase shifter 193 in the figure) of the phase step at a defocus position close to the image formation optical system.

BRIEF SUMMARY OF THE INVENTION

It is an object of the present invention to provide a technique which can stably form a desired light intensity distribution with an inverse peak shape at a desired position and form a crystal grain to a semiconductor film with a high filling ratio.

According to a first aspect of the present invention, there is provided a light irradiation apparatus comprising:

a light modulation element which has a phase step having a phase difference substantially different from 180°;

an illumination optical system which illuminates the light modulation element; and an image formation optical system which forms, on an irradiation surface, a light intensity distribution based on a light beam phase-modulated by the light modulation element, wherein the illumination optical system illuminates the light modulation element with an illumination light beam inclined in a direction normal to a step line of the phase step.

According to a preferred mode of the first aspect, it is preferable that the light modulation element has a phase step having a phase difference substantially smaller than 180° and the illumination optical system illuminates the light modulation element along a direction containing a component directed from a phase delay side toward a phase advance side of the phase step. Alternatively, it is preferable that the light modulation element has a phase step having a phase difference substantially larger than 180° and the illumination optical system illuminates the light modulation element along a direction containing a component directed from a phase advance side toward a phase delay side of the phase step.

Further, according to the preferred mode of the first aspect, the illumination optical system has a wedge-shaped prism arranged on a light incidence side of the light modulation element. Alternatively, it is preferable that the illumination optical system has an aperture diaphragm arranged at or in the vicinity of an exit pupil and an aperture portion of the aperture diaphragm is deviated from an optical axis. Furthermore, it is preferable that the light modulation element has a phase modulation pattern which is used to form a light intensity distribution which varies along a direction of a step line of the phase step. Moreover, it is preferable that the phase step is formed based on a difference in vectorial average value of phase modulation quantities in a point spread function range of the image formation optical system.

According to a second aspect of the present invention, there is provided a crystallization apparatus comprising: the light irradiation apparatus according to the first aspect; and a stage which holds a non-single-crystal semiconductor film on a predetermined surface, wherein the crystallization apparatus generates a crystallized semiconductor film by irradiating a non-single-crystal semiconductor film held on the predetermined surface with a light beam having the predetermined light intensity distribution.

According to a third aspect of the present invention, there is provided a crystallization method which generates a crystallized semiconductor film by irradiating a non-single-crystal semiconductor film held on the predetermined surface with a light beam having the predetermined light intensity distribution by using the light irradiation apparatus according to the first aspect.

According to a fourth aspect of the present invention, there is provided a device manufactured by using the crystallization apparatus according to the second aspect or the crystallization method according to the third aspect.

In the crystallization apparatus according to the typical mode of the present invention, since a light modulation element is illuminated with an illumination light beam inclined in a direction crossing a step line of a phase step of the light modulation element, even if a light modulation element which has a phase step having a phase difference substantially different from 180°, the symmetry of, e.g., a light intensity distribution with an inverse peak shape can be excellently maintained without being dependent on a defocus direction, and hence a deep depth of focus can be realized. As a result, in the present invention, a desired light intensity distribution with an inverse peak shape can be stably formed at a desired position, and a crystal grain can be formed to a semiconductor film with a high filling ratio.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a view schematically showing a configuration of a crystallization apparatus according to a mode of the present invention;

FIG. 2 is a view schematically showing an internal configuration of an illumination optical system depicted in FIG. 1;

FIG. 3 is a view schematically showing a part of a phase shifter depicted in FIG. 1;

FIGS. 4A and 4B are views illustrating a factor which causes a position of a bottom peak to be shifted in accordance with defocusing;

FIGS. 6A and 6B are views illustrating that a displacement of the bottom peak can be substantially avoided by irradiating the phase shifter with the inclined illumination light;

FIG. 7 is a view showing a relationship between a phase difference (degrees) of the phase step and an optimum incidence angle $\theta_0$ (degrees) of the illumination light;

DETAILED DESCRIPTION OF THE INVENTION

Figure 5:
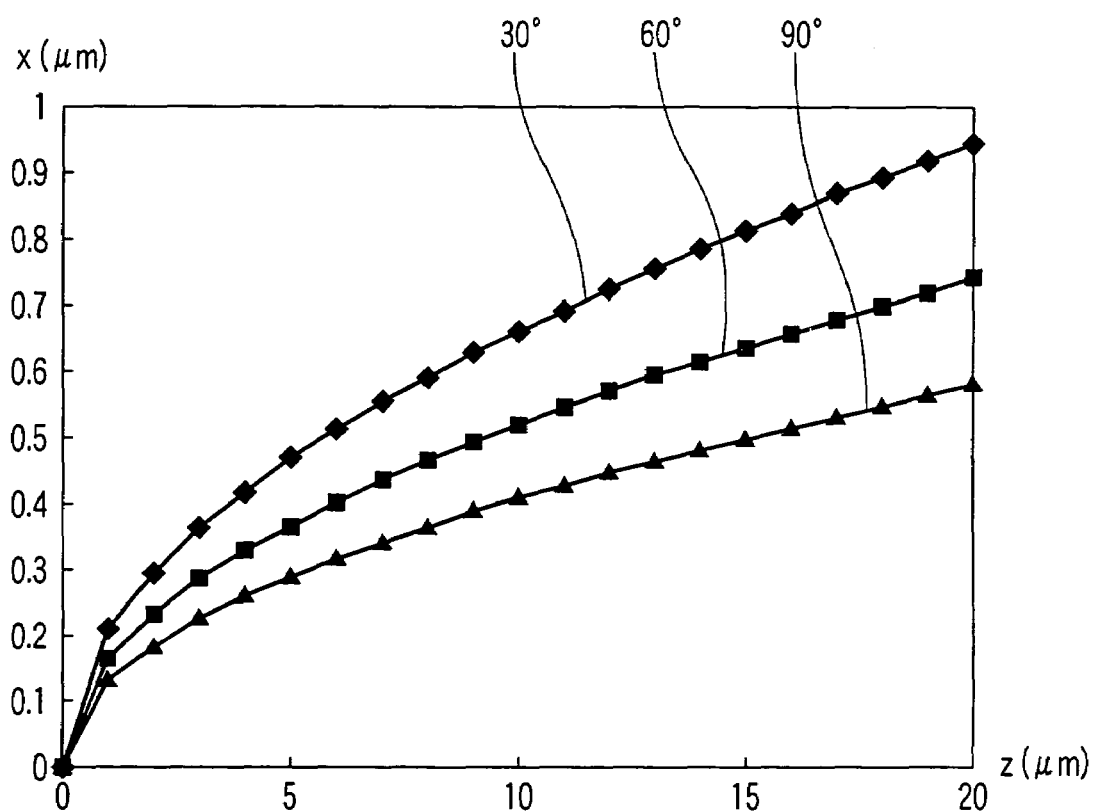
FIG. 5 is a view showing a relationship between a displacement quantity x of a bottom peak and a distance z of a three-dimensional light intensity distribution from the phase shifter.

A mode of the present invention will now be described based on the accompanying drawings. FIG. 1 is a view schematically showing a configuration of a crystallization apparatus according to the mode of the present invention. Further, FIG. 2 is a view schematically showing an internal configuration of an illumination optical system depicted in FIG. 1. Referring to FIGS. 1 and 2, the crystallization apparatus according to this mode comprises a phase shifter (a light modulation element) 1 which forms a light beam having a predetermined light intensity distribution by modulating a phase of an incident light beam, an illumination optical system 10 which illuminates the phase shifter, an image formation optical system 4, and a substrate supporting stage 6 which holds a processed substrate 5.

As shown in FIG. 3, the phase shifter 1 is constituted by repeatedly arranging unit patterns in a lateral direction (in a right-and-left direction in the figure). The unit pattern includes four phase areas 1a to 1d aligned along one direction. Specifically, the unit pattern of the phase shifter 1 has a configuration in which a first phase area 1a having a reference phase value, a second phase area 1b having a phase value of +90° with respect to the first phase area 1a (a relative phase difference when a phase modulation quantity in the first phase area 1a is normalized as zero), a third phase area 1c having a phase value of +180° with respect to the first phase area 1a and a fourth phase area 1d having a phase value of +270° with respect to the first phase area 1a are adjacently aligned in sequence from the right side toward the left side in the drawing.

Therefore, when a parallel light beam vertically enters the unit pattern of the phase shifter 1, with a phase of the light transmitted through the first phase area 1a being determined as a reference, a phase of the light beam transmitted through the second phase area 1b is advanced by 90°, a phase of the light transmitted through the third phase area 1c is advanced by 180°, and a phase of the light transmitted through the fourth phase area 1d is advanced by 270°. In other words, at a phase step formed between arbitrary two phase areas, the phase is sequentially advanced by 90° from the right side toward the left side in the drawing. The respective phase areas 1a to 1d have the same widthwise distance or width w along the unit pattern repeat direction.

The illumination optical system 10 comprises an illumination optical system main body 2, and a wedge-shaped prism 3 which is arranged between the illumination optical system main body 2 and the phase shifter 1 and immediately before the phase shifter 1. The optical system main body 2 comprises a KrF excimer laser light source 2a which emits a light beam having a wavelength of, e.g., 248 nm. As the light source 2a, it is also possible to use any other appropriate light source such as an XeCl excimer light source or a YAG laser light source which has a performance of projecting an energy light beam which melts a crystallization processing target substance. A laser light beam emitted from the light source 2a is expanded through a beam expander 2b and then enters a first fly-eye lens 2c.

In this manner, a plurality of small light sources are formed on a rear focal plane of the first fly-eye lens 2c, and an incidence surface of a second fly-eye lens 2e is illuminated with light fluxes (beamlets) from the plurality of small light sources in an overlapping manner through a first condenser optical system 2d. As a result, more small light sources are formed on a rear focal plane of the second fly-eye lens 2e than those on the rear focal plane of the first fly-eye lens 2c. The phase shifter 1 is illuminated with a light beam of the beamlets from the plurality of small light sources formed on the rear focal plane of the second fly-eye lens 2e in an overlapping manner through a second condenser optical system 2f and the wedge-shaped prism 3. A configuration and effect of this wedge-shaped prism 3 will be described later.

The first fly-eye lens 2c and the first condenser optical system 2d constitute a first homogenizer. The first homogenizer homogenizes the laser beam emitted from the light source 2a in relation to an incidence angle on the phase shifter 1. Further, the second fly-eye lens 2e and the second condenser optical system 2f constitute a second homogenizer. The second homogenizer homogenizes the laser light beam having the homogenized incidence angle from the first homogenizer in relation to a light intensity at each in-plane position on the phase shifter 1.

In this manner, the illumination optical system 10 irradiates the phase shifter 1 with the laser light beam having a substantially homogeneous light intensity distribution. The homogenized laser light beam which has entered the phase shifter 1 and phase-modulated by the phase shifter 1 is incident onto the processed substrate 5 through the image formation optical system 4. In this example, the image formation optical system 4 arranges a phase pattern plane of the phase shifter 1 and the processed substrate 5 in an optically conjugate relationship. In other words, the processed substrate 5 is set to a surface (an image plane of the image formation optical system 4) which is optically conjugate with the phase pattern surface of the phase shifter 1.

The image formation optical system 4 includes a first positive lens assembly 4a, a second positive lens assembly 4b and an aperture diaphragm 4c arranged between these lens assemblies. A size of an aperture-portion (a light transmission portion) of the aperture diaphragm 4c (and hence an image side numeral aperture NA of the image formation optical system 4) is set in such a manner that a necessary light intensity distribution is generated on a semiconductor film of the processed substrate 5. The image formation optical system 4 may be a refraction type optical system, may be a reflection type optical system, or may be a refraction/reflection type optical system.

The processed substrate 5 is configured by forming a lower layer insulating film, a semiconductor thin film and an upper layer insulating film on a substrate in the mentioned order. That is, the processed substrate 5 is obtained by sequentially forming an underlying insulating film, a non-single-crystal film, e.g., an amorphous silicon film and a cap film on a transparent substrate of, e.g., liquid crystal display sheet glass by chemical vapor deposition (CVD). Each of the underlying insulating film and the cap film is an insulating film made of, e.g., $SiO_2$. The underlying insulating film avoids diffusing of foreign particles such as Na into the amorphous silicon film caused due to direct contact between the amorphous silicon film and the glass substrate, and prevents heat of the amorphous silicon film from being directly transmitted to the glass substrate.

The amorphous silicon film is one of semiconductor films to be crystallized. The cap film is heated by a part of a light beam which enters the amorphous silicon film, and stores a temperature when heated. Although a temperature of a high-temperature region in the irradiation target surface of the amorphous silicon film is relatively rapidly reduced when incidence of a light beam is interrupted, this thermal storage effect alleviates this temperature drop gradient and facilitates the crystal growth with a large particle size in the lateral direction. The processed substrate 5 is positioned and held at a predetermined position on the substrate stage 6 by a vacuum chuck, an electrostatic chuck or the like.

As described above, in the prior art, when a phase shifter having a phase step whose phase difference is substantially different from 180°, e.g., a phase shifter having a phase step whose phase difference is 60° is used, the symmetry of a light intensity distribution with an inverse peak shape formed at a defocus position or plane of the image formation optical system 4 largely collapses, and a position of a bottom peak of this distribution is shifted. A description will now be given as to a factor which shifts a position of the bottom peak in accordance with defocusing with respect to the image formation optical system 4 when a phase difference of the phase step of the phase shifter 1 is substantially different from 180° with reference to FIGS. 4A and 4B.

Figure 17A:
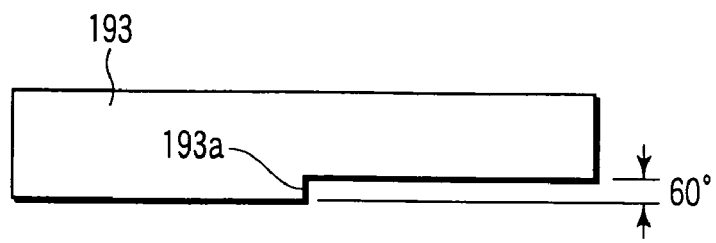
FIGS. 17A to 17D are views illustrating light intensity distributions with an inverse peak shape formed through the image formation optical system when a phase shifter having a phase difference of 60° is used.
Figure 17B:
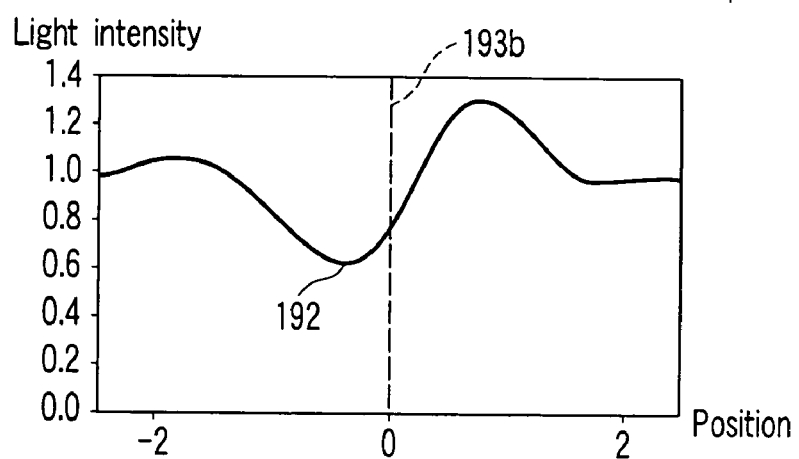
Figure 17C:
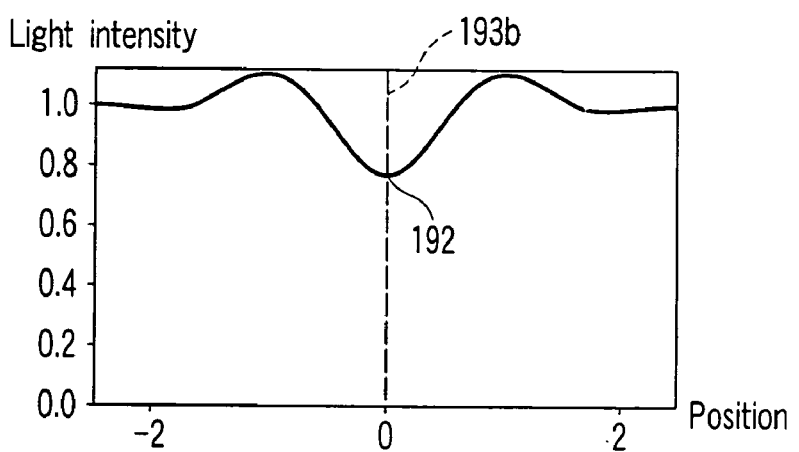
Figure 17D:
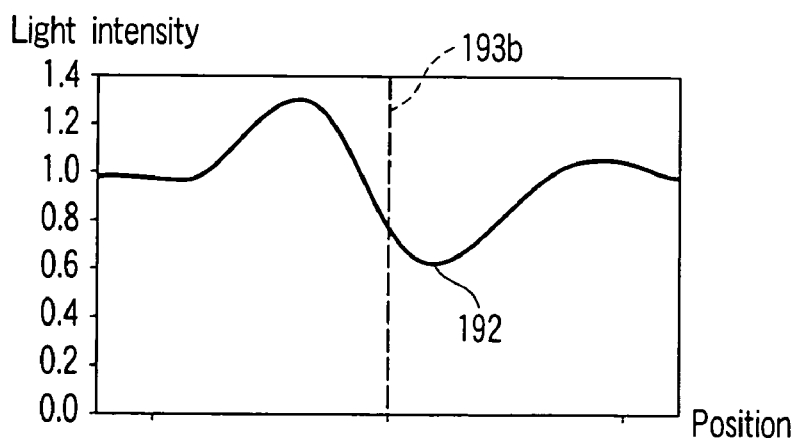
Figure 18:
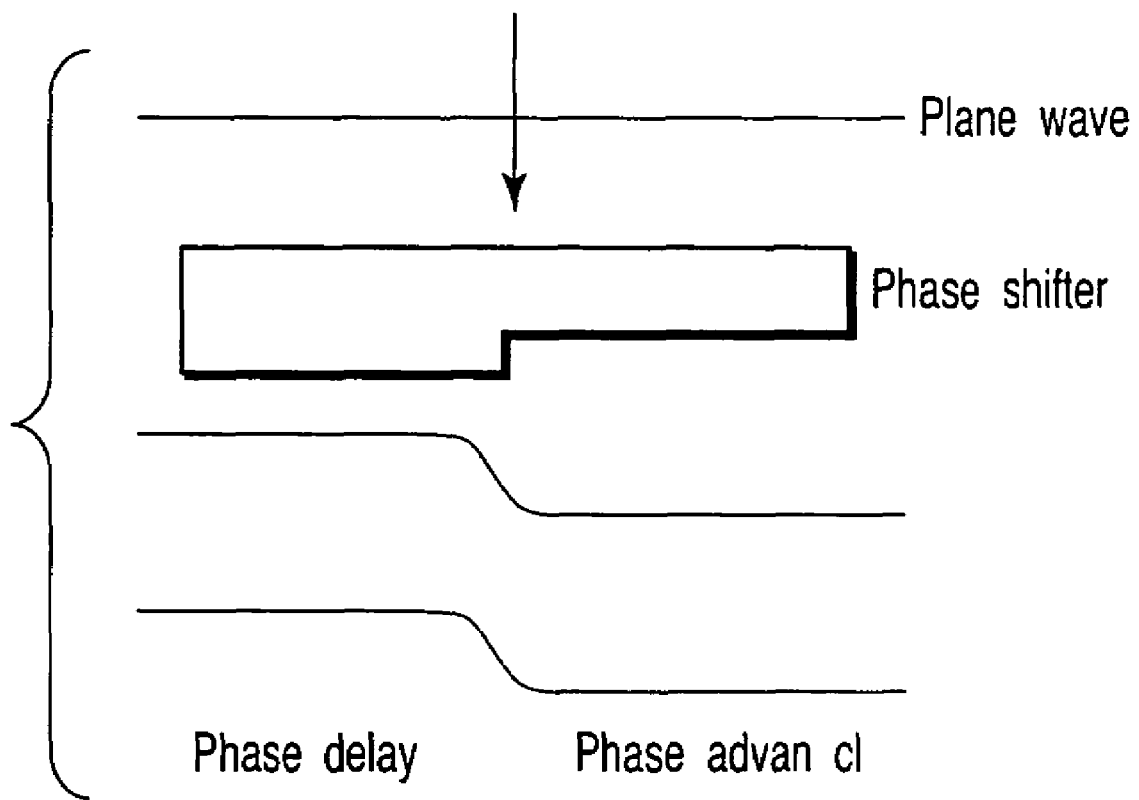
FIG. 18 is a view for explaining definition of a phase delay and a phase advance.

First, it is assumed that the above-described wedge-shaped prism 3 is not interposed between the illumination optical system main body 2 and the phase shifter 1, and approximation is performed provided that an illumination light beam which enters the phase shifter 1 is a parallel light beam vertical to the phase shifter 1. This is a state called coherent image formation. Additionally, considering image formation at a defocus position of the image formation optical system 4, it is decided that a three-dimensional light intensity distribution immediately after the phase shifter 1 (indicated by a broken line in FIG. 4A) is obtained and an image of the three-dimensional light intensity distribution is formed immediately after an irradiation target surface (a semiconductor film of the processed substrate 5) by the image formation optical system 4. As has been described with reference to FIGS. 17B and 17D, the three-dimensional light intensity distribution immediately before the irradiation target surface is symmetrical with respect to the three-dimensional light intensity distribution immediately after the irradiation target surface. The fact that these assumptions or approximations have the sufficient accuracy is described in the embodiment.

A three-dimensional light intensity distribution immediately after (in the vicinity of a light projection surface) of the phase shifter 1 is analytically obtained as Becke's line generated by Fresnel diffraction at the boundary of phase objects. In regard to this point, reference can be made a document such as "Applied Optics I" by Tsuruta, Baifukan Co., Ltd, pp. 172-175, 1990. The content of this document is incorporated herein. According to this document, a three-dimensional light intensity distribution formed immediately after a phase step having a phase difference substantially smaller than 180° has the darkest part, i.e., a bottom peak at a position deviated from a position of the phase step to a high refraction factor side or a side where a phase is advanced (a phase advance side) (see FIG. 4B)

Furthermore, a displacement quantity or distance x of the bottom peak with the position of the phase step 1a being determined as a reference becomes large in proportion to a square root of a distance z from the phase shifter 1. In a case of considering the distance z, a depth of the phase step 1a (distance between both surfaces defining the phase step therebetween) may be presumed to be extremely short. That is, the displacement quantity x of the bottom peak from the phase step 1a is represented by the following Expression (1). In Expression (1), $\lambda$ is a wavelength of a light beam used, z is a distance of the three-dimensional light intensity distribution from the phase shifter 1, and $\omega_0$ is a constant value which is determined by a phase difference of the phase step and corresponds to the bottom peak.

$$x = \omega_0 \times (\lambda \cdot z/2)^{1/2} \qquad (1)$$

For example, when the phase difference of the phase step is 90°, the bottom peak appears at a position of $\omega_0 = 0.37$ based on an analysis result of Becke's line. Therefore, assuming that $\lambda = 0.248$ μm and $z = 10$ μm, the displacement distance x of the bottom peak from the phase step is $x = 0.41$ μm. FIG. 5 shows a calculated relationship between the displacement distance x of the bottom peak and the distance z of the three-dimensional light intensity distribution from the phase shifter 1 when the wavelength of a light used is fixed to $\lambda = 0.248$ μm and the phase differences of the phase step are set to 30°, 60° and 90°, respectively.

In this embodiment, the wedge-shaped prism 3 is arranged in close proximity to the phase shifter 1 on an optical path between the illumination optical system main body 2 and the phase shifter 1. Additionally, as shown in FIG. 6B, a light ray indicated by an arrow a which has vertically entered the prism 3 is converted into a light ray indicated by an arrow b which is inclined in a direction orthogonal to a step line of the phase step of the phase shifter 1 by the effect of the wedge-shaped prism 3, and the phase shifter 1 is illuminated with this illumination light beam, thereby substantially avoiding a displacement of the bottom peak due to defocusing. FIG. 6A shows a state in which the wedge-shaped prism 3 is not arranged for the purpose of comparison. A description will now be given as to the point that the displacement of the bottom peak is substantially avoided by the inclined illumination light.

As general characteristics of Fresnel diffraction, a diffraction image is changed into a shape converted into a conversion coordinate ($x_m$) of the following Expression (2) by inclining an angle of the illumination light beam which enters the phase shifter 1 as the light modulation element by θ from the vertical state.

$$x_m = x - \tan\theta \cdot z \qquad (2)$$

That is, the light intensity distribution formed at a position or plane apart from the phase shifter 1 by the distance z is shifted by a distance represented as (tan θ·z) in the lateral direction along which the illumination light obliquely advances. Therefore, the displacement of the bottom peak due to defocusing can be corrected by adjusting the inclination angle θ of the illumination light beam in the plane parallel to the lateral direction. In this case, although it is desirable to match the position of the bottom peak with the position of the step line of the phase step of the phase shifter 1 with respect to all values of the distance z, this is impossible since a dark area (an area close to the peak of the inverse peak pattern) is curved.

However, a rough correction is enabled within a range of $-z_0$ to $+z_0$ by determining a target distance $z_0$ and matching the position of the bottom peak with the position of the step line of the phase step of the phase shifter 1 at this distance $z_0$. An optimum incidence angle $\theta_0$ of the illumination light required for this correction satisfies the following Expression (3) and is presented by the following Expression (4).

$$x_m = x_0 - \tan\theta_0 \cdot z_0 = 0 \qquad (3)$$

$$\theta_0 = \tan^{-1}[\omega_0 \cdot \{\lambda/(2 \cdot z_0)\}^{1/2}] \qquad (4)$$

Specifically, when the phase difference of the phase step of the phase shifter 1 is 90°, $\omega_0 = 0.37$ is achieved. Therefore, assuming that $\lambda = 0.248$ μm and $z_0 = 10$ μm, the optimum incidence angle of the illumination light beam is $\theta_0 = 2.4°$ (0.041 rad (radian)). FIG. 7 shows a relationship between the phase difference (degrees) of the phase step of the phase shifter 1 and the optimum incidence angle $\theta_0$ (degrees) of the illumination light under the same condition ($\lambda = 0.248$ μm, $z_0 = 10$ μm).

As described above, in the three-dimensional light intensity distribution formed immediately after the phase step having a phase difference substantially smaller than 180°, the bottom peak is shifted from a position of the phase step (from the virtual line corresponding to the phase step) to the phase delay side. Therefore, in this case, in order to correct the displacement of the bottom peak due to defocusing, it is good enough to illuminate the phase shifter 1 along a direction containing a component which is directed from the phase advance side to the phase delay side of the phase step. On the other hand, in the three-dimensional light intensity distribution formed immediately after the phase step having a phase difference substantially larger than 180°, the bottom peak is shifted from the position of the phase step to the phase advance side. Therefore, in this case, in order to correct the displacement of the bottom peak due to defocusing, it is good enough to illuminate the phase shifter 1 along a direction containing a component directed from the phase delay side to the phase advance side of the phase step.

In the above description, it is assumed that the image formation optical system 4 is an equal-magnification optical system when obtaining the optimum incidence angle $\theta_0$ of the illumination light. In general, when using the image formation optical system whose magnification is 1/M, an inclination angle $\theta_0$ ($=\theta_0'/M$) of the illumination light beam with which the phase shifter 1 should be actually irradiated is obtained by calculating the optimum incidence angle $\theta_0'$ of the illumination light beam by the similar calculation converted to the image surface side of the image formation optical system and dividing a value of the obtained angle $\theta_0'$ by M.

As shown in FIG. 6B, when oblique illumination is realized by providing the wedge-shaped prism (a small-angle prism or a wedge prism) 6 immediately before the phase shifter 1 as the light modulation element, a relationship represented by the following Expression (5) is achieved between a prism angle (an apex angle of the wedge-shaped prism 3) $\phi$ and a deflection angle θ of a vertical incident light ray.

$$\theta \approx \phi(n-1) \qquad (5)$$

In this expression, n is a refraction index of an optical material forming the wedge-shaped prism 3. Specifically, in order to assure the deflection angle θ equal to the optimum incidence angle $\theta_0 = 2.4°$ of the illumination light when the phase difference of the phase step of the phase shifter 1 is 90°, it can be understood that using the wedge-shaped prism 3 having a prism angle of $\phi = 4.8°$ can suffice when a refraction index of the optical material forming the wedge-shaped prism 3 is n=1.508.

In this mode, the effect of the present invention is verified in an embodiment based on specific numerical values. In this embodiment, a wavelength of the light beam is 248 nm (=0.248 μm; an excimer laser light), a magnification of the image formation optical system 4 is one power (an equal magnification), an image side numeral aperture NA of the image formation optical system 4 is 0.13, and an illumination sigma value (a coherence factor; a numeral aperture of the illumination optical system 10/an object side numeral aperture of the image formation optical system 4) is 0.47. Additionally, in the phase shifter 1 depicted in FIG. 3, a widthwise dimension or width w of each of the phase areas 1a to 1d is 5 μm.

Figure 8A:
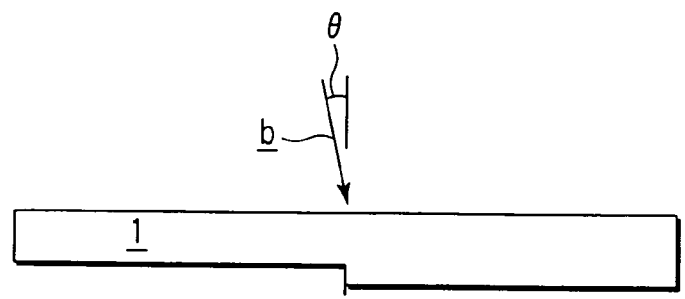
FIGS. 8A to 8C are views illustrating light intensity distributions formed on a surface of a processed substrate by oblique illumination in an embodiment of the mode.
Figure 8B:
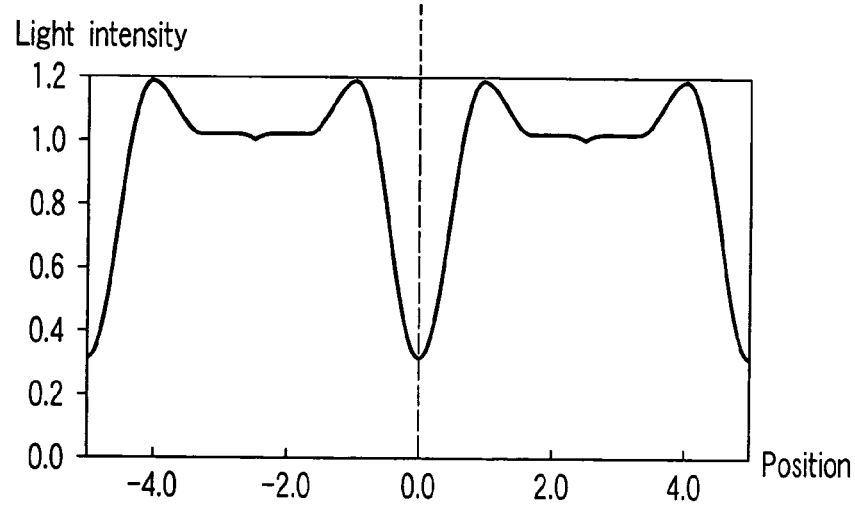
Figure 8C:
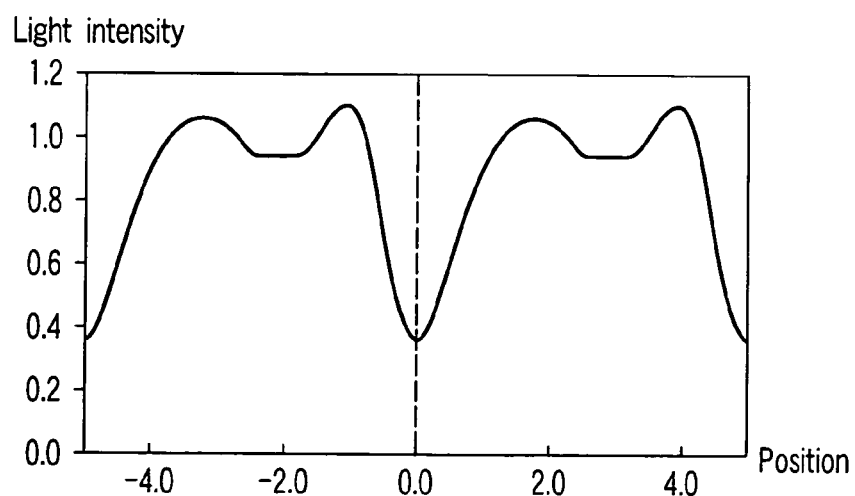
Figure 9A:
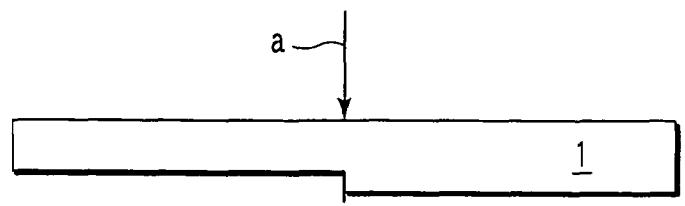
FIGS. 9A to 9C are views illustrating light intensity distributions formed on the surface of the processed substrate by vertical illumination according to a prior art.

Further, as shown in FIG. 6B, the phase shifter 1 is illuminated with the illumination light beam indicated by an arrow b which has an incidence angle of θ=2.4° inclined in a direction containing a component directed from the phase advance side toward the phase delay side of the phase step by using the wedge-shaped prism 3 having a prism angle of φ=4.8°. As a result, in this embodiment, such light intensity distributions as shown in FIGS. 8B and 8C are obtained on the upper surface of the processed substrate 5. On the other hand, in a comparative example, the phase shifter 1 is illuminated with an illumination light beam which vertically enters in accordance with the prior art under the same conditions as this embodiment. As a result, such light intensity distributions as shown in FIGS. 9B and 9C are obtained on the upper surface of the processed substrate 5 in the comparative example.

Figure 9B:
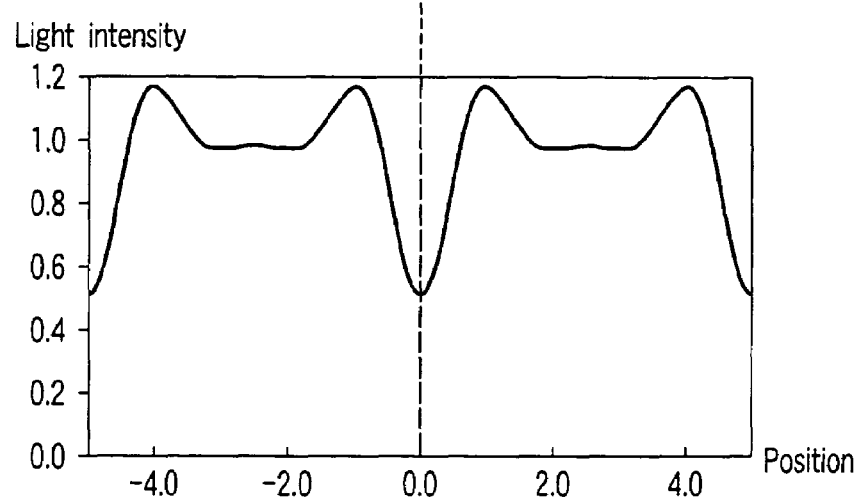
Figure 9C:
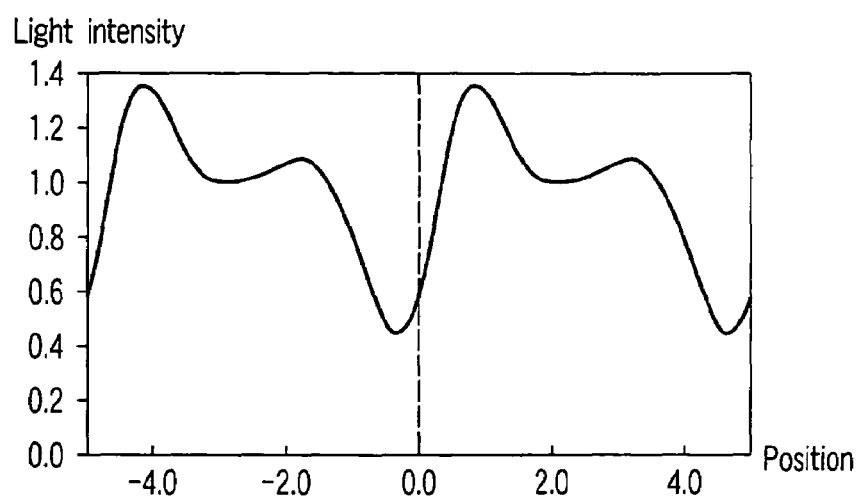

In case of the comparative example using vertical illumination (illumination from a direction indicated by an arrow a in FIG. 9A), the light intensity distribution with the inverse peak shape formed at the focus position of the image formation optical system 4 is substantially symmetrical as shown in FIG. 9B. However, at a defocus position slightly moved from the focus position of the image formation optical system 4 toward the lower side by 10 μm (in a direction apart from the image formation optical system 4), as shown in FIG. 9C, the symmetry of the light intensity distribution with the inverse peak shape to be formed largely collapses, and the position of the bottom peak of this distribution is shifted toward the phase delay side of the phase step. Furthermore, in vertical illumination, a peak on the phase advance side (the right side in the figure) is greatly increased due to defocusing.

Conversely, in case of this embodiment using oblique illumination or inclined illumination (illumination from a direction indicated by an arrow b in FIG. 8A), the light intensity distribution with the inverse peak shape formed at the focus position of the image formation optical system 4 is substantially symmetrical as shown in FIG. 8B. Moreover, at a defocus position slightly moved from the focus position of the image formation optical system 4 toward the lower side by 10 μm, as shown in FIG. 8C, the symmetry of the light intensity distribution with the inverse peak shape to be formed is excellently maintained, and a position of the bottom peak of this distribution is also excellently maintained at a position corresponding to the step line of the phase step without being substantially shifted. Additionally, in oblique illumination, the peak of the light intensity distribution with the inverse peak shape is substantially constant without being substantially increased even if defocusing is effected.

As described above, in this embodiment, a crystal nucleus is formed on or near the surface of the processed substrate 5 in the vicinity of a position corresponding to the step line of each of the phase steps of the phase shifter 1, and a crystal (more specifically two grains from one nucleus) is grown from this crystal nucleus in a direction orthogonal to the step line (the lateral direction), thereby filling crystal grains in a predetermined area of the semiconductor film. At this moment, even if the upper surface of the processed substrate 5 is shifted with respect to the focus position of the image formation optical system 4 in the vertical direction by 10 μm, the position of each crystal grain is hardly shifted in the plane, and a part or parts of the semiconductor film are not destroyed due to ablation.

As described above, in this embodiment, since the phase shifter 1 is illuminated with the illumination light beam inclined in a direction orthogonal to the step line of the phase step of the phase shifter 1, even if the phase shifter 1 having the phase step whose phase difference is substantially different from 180° is used, the symmetry of the light intensity distribution with the inverse peak shape is excellently maintained without being dependent on the defocus direction, and hence a deep depth of focus can be realized. As a result, a desired light intensity distribution with an inverse peak or peaks can be stably formed at a desired position or positions, and a crystal grain or grains can be formed in the semiconductor film with a high filling ratio.

Figure 10:
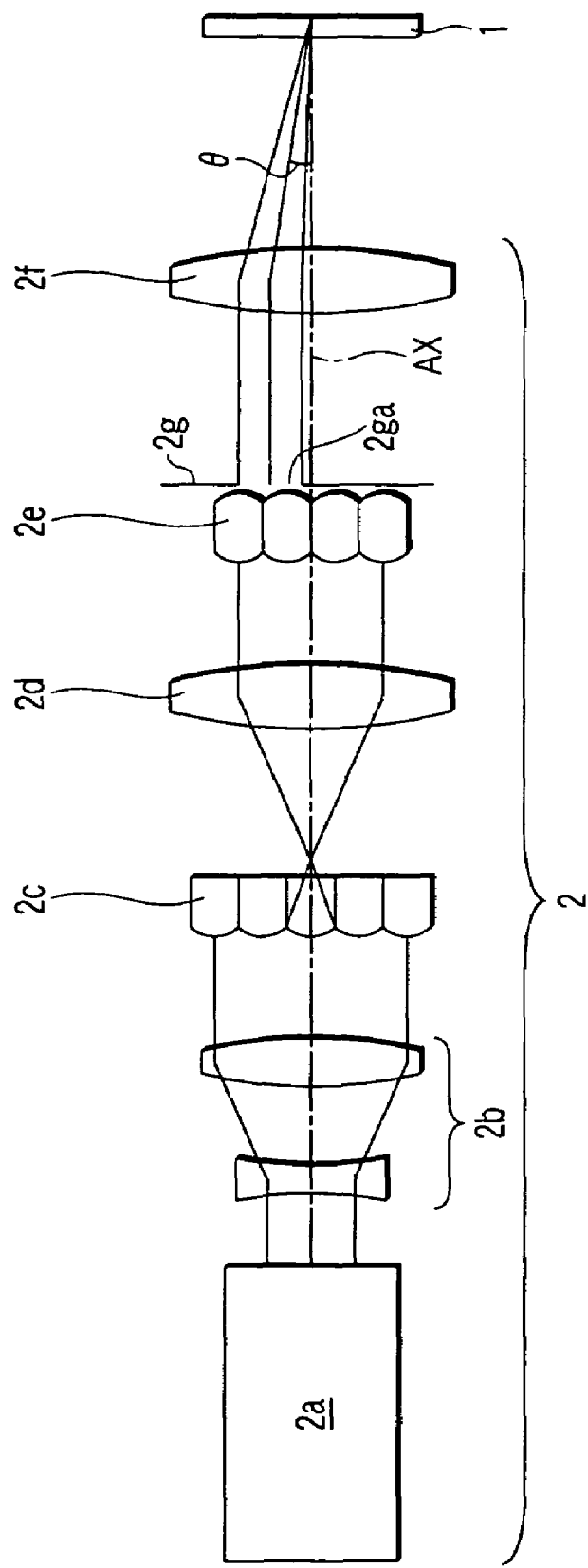
FIG. 10 is a view schematically showing a modification of a configuration which obliquely illuminates the phase shifter.

In the foregoing embodiment, the phase shifter 1 is illuminated with the illumination light beam which is inclined at a necessary angle from the vertical direction by the deflection angle effect of the wedge-shaped prism 3 arranged immediately before the phase shifter 1. Forming such an illumination light is not restricted to the above-described technique. For example, as shown in FIG. 10, it is also possible to use a modification in which an aperture diaphragm 2g is arranged at or in the vicinity of (i.e., in the vicinity of the light projection surface of the second fly-eye lens 2e) of an exit pupil of the illumination optical system 2. In this case, the phase shifter 1 can be illuminated with an illumination light beam which is inclined at a necessary angle θ from the vertical direction by deviating an aperture portion (a light transmission portion) 2ga of the aperture diaphragm 2g with respect to an optical axis AX by a predetermined distance.

Figure 11:
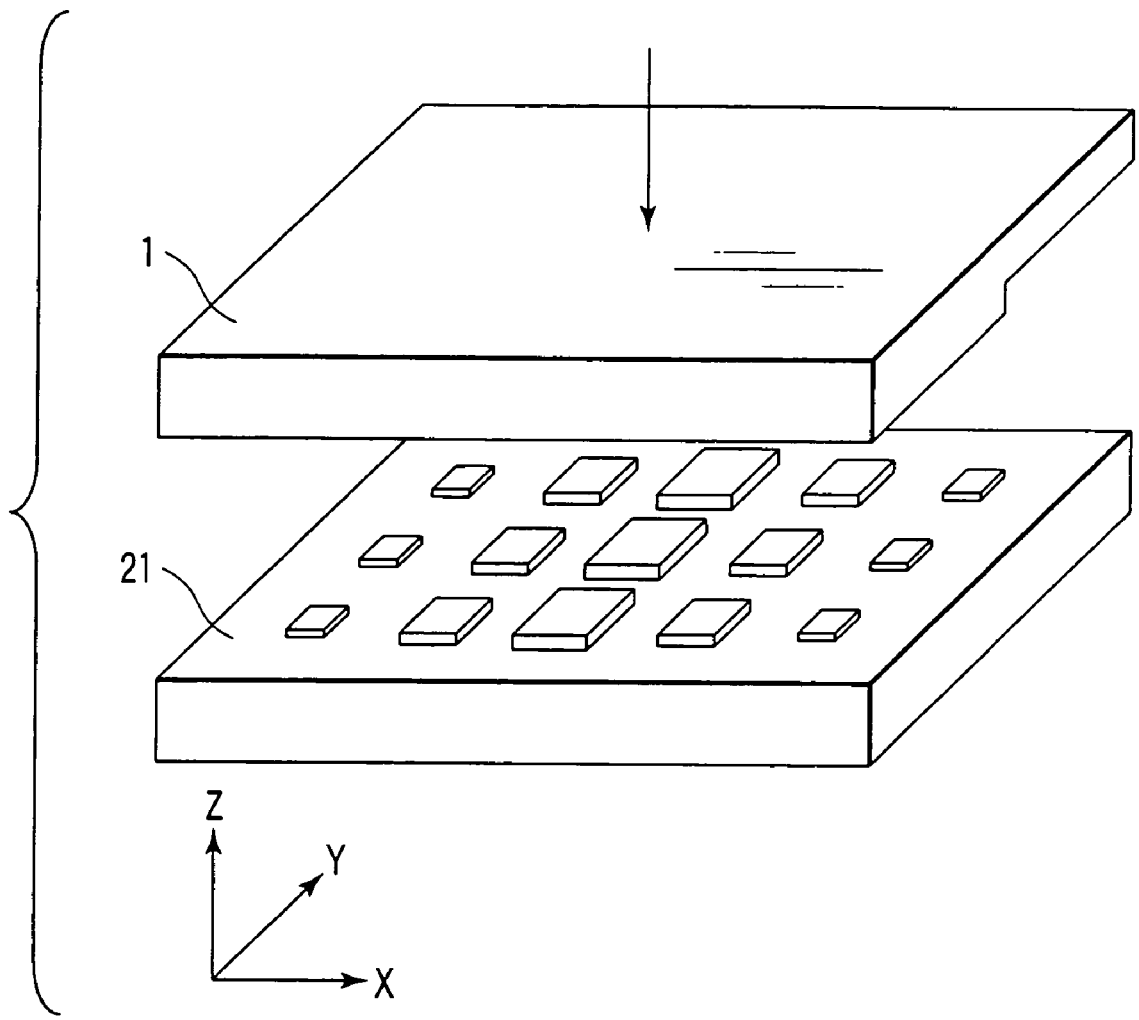
FIG. 11 is a view showing a modification in which a second light modulation element which forms a light intensity gradient distribution based on an incident light beam is additionally provided.

Additionally, in the foregoing embodiment, the phase shifter 1 which forms a light intensity distribution with an inverse peak shape by the phase step is used. However, as shown in FIG. 11, it is also possible to use a second light modulation element 21 having a pattern which forms a light intensity gradient distribution based on an incident light beam in addition to the phase shifter (the light modulation element) 1 which forms a light intensity distribution with an inverse peak shape (i.e. a plurality of inverse peaks). Here, the second light modulation element 21 is arranged in such a manner that a phase pattern surface thereof faces a phase pattern surface of the phase shifter 1. In FIG. 11, the step line of the phase step of the phase shifter 1 is extended along the X direction.

Figure 12:
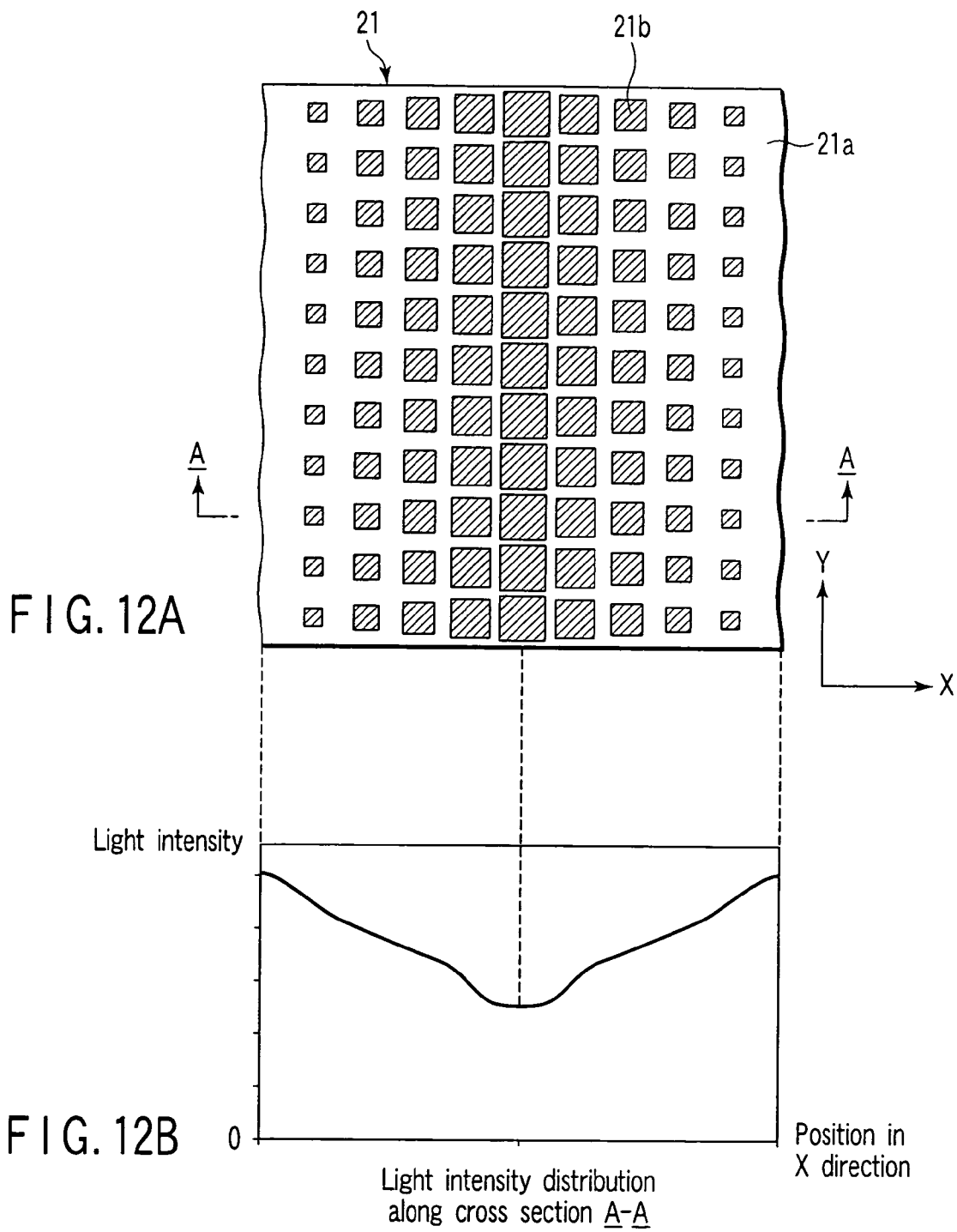
FIG. 12A is a view showing a pattern of the second light modulation element in the modification depicted in FIG. 11.
FIG. 12B is a view showing a light intensity distribution obtained when this second light modulation element is used.

As shown in FIG. 12A, the second light modulation element 21 has a plurality of cells each of which is optically smaller than a radius of a point spread function range of the image formation optical system 4 in size. To each cell are formed a first area (indicated by a blank portion in the figure) 21a having a phase value of, e.g., zero and a second areas (indicated by a shaded portion in the figure) 21b having a phase value of, e.g., +90°. Further, area share ratios of the first area 21a and the second area 21b in each cell are different in accordance with each cell. Specifically, an area share ratio of the first area 21a in a cell is closest to 50% in a central cell in the figure, whilst it is closest to 100% in each of cells on the both sides in the figure, and the area share ratio monotonously varies between these cells along the X direction.

In this manner, as shown in FIG. 12B, there can be obtained a one-dimensional (having a gradient in the X direction) V-shaped light intensity gradient distribution in which a light intensity is maximum at both side positions where the area share ratio of the first area 21a is closest to 100%. The light intensity is minimum at a central position where the area share ratio of the first area 21a is closest to 50% by the effect of the second light modulation element 21. The second light modulation element 21 can be manufactured by forming a thickness distribution corresponding to a necessary step on, e.g., a quartz glass substrate. A change in thickness of the quartz glass substrate can be formed by, e.g., selective etching.

Figure 13:
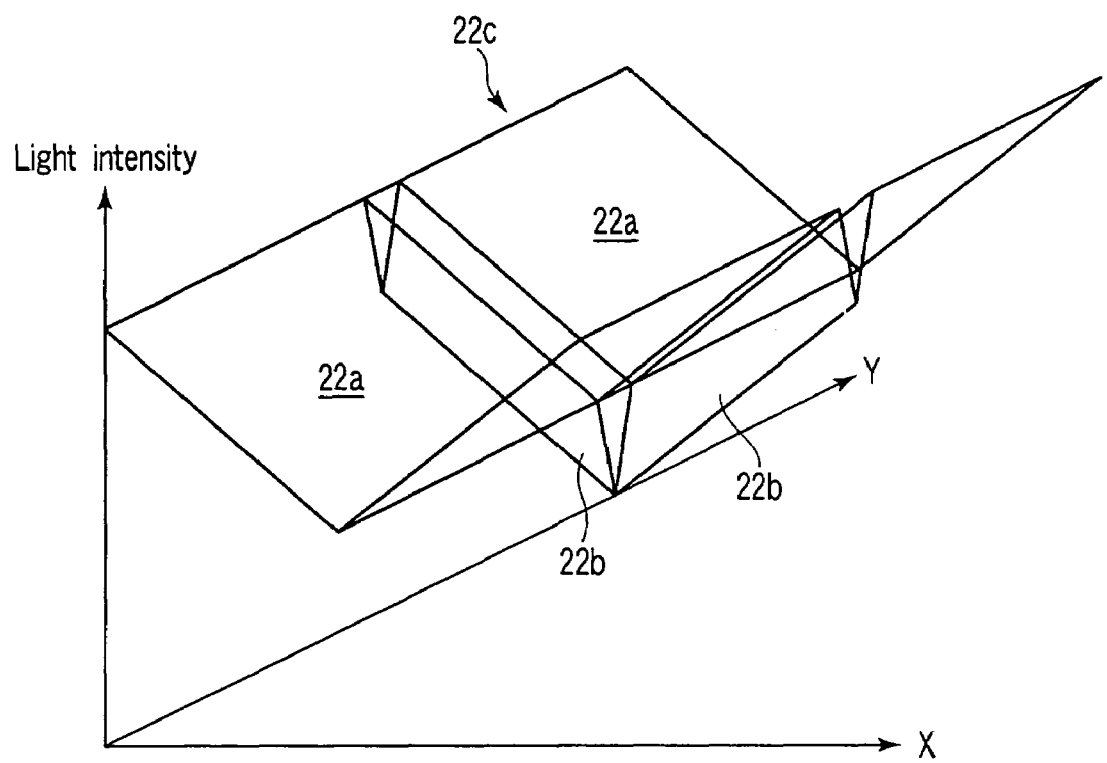
FIG. 13 is a perspective view showing a combined light intensity distribution obtained from a V-shaped light intensity gradient distribution formed in the modification depicted in FIG. 11 and a light intensity distribution with an inverse peak shape.

As a result, in the modification of FIG. 11, as shown in FIG. 13, a combined light intensity distribution obtained from the one-dimensional V-shaped light intensity gradient distribution 22a formed through the second light modulation element 21 and the light intensity distribution with the inverse peak shape 22b formed through the phase shifter 1, e.g., a light intensity distribution 22c having a V-shaped pattern and an inverse-peak-shaped pattern is formed on the surface of the processed substrate 5. As a result, in the modification of FIG. 11, the sufficient crystal growth in the lateral direction from a crystal nucleus can be realized along a gradient direction (the X direction) of the light intensity in the one-dimensional V-shaped light intensity gradient distribution 22a, thereby generating a crystallized semiconductor film with a large crystal grain size.

In the modification of FIG. 11, in view of focusing by the image formation optical system 4, it is desirable to arrange the phase pattern surface of the first phase shifter 1 and the phase pattern surface of the second light modulation element 21 in close proximity to each other as much as possible. For example, the phase shifter 1 may be attached to the second light modulation element 21, and these members may be used in the attached state.

Although the second light modulation element 21 is arranged on the rear side of the first phase shifter 1 in the above example, the present invention is not restricted thereto, and the first phase shifter 1 may be arranged on the rear side of the second light modulation element 21. Further, although the phase shifters 1, 21 are separately used, the present invention is not restricted thereto, and it is possible to use one light modulation element having a combined phase pattern obtained from the phase patterns of the first and second phase shifters 1, 21, for example.

Figure 14:
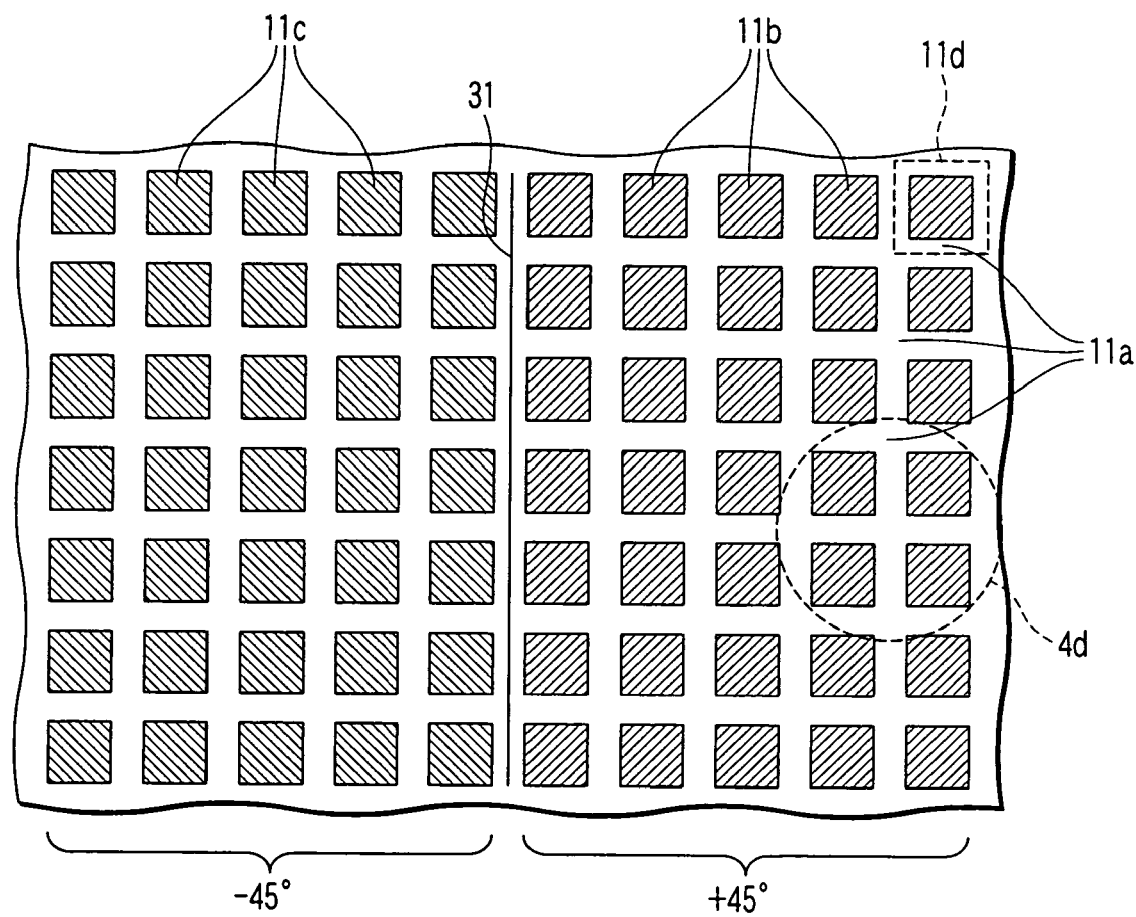
FIG. 14 is a view schematically showing a configuration of a light modulation element according to the modification.

Furthermore, in the foregoing embodiment, the phase step having a phase difference of 90° is formed between the flat first phase area 1a having a phase value of, e.g., zero and the flat second phase area 1b having a phase value of +90° in the unit pattern of the phase shifter 1. However, the present invention is not restricted thereto, and it is possible to employ a modification in which a phase step having a phase difference of, e.g., 90° is formed based on a difference in vectorial average value of phase modulation values in a point spread function range 4d (a range within a circle indicated by a broken line) of the image formation optical system 4 as shown in FIG. 14. Here, the point spread function range of the image formation optical system 4 is a range surrounded by a line which becomes zero or can be regarded as zero in the point spread function. In general, assuming that NA is a numeral aperture of the image formation optical system 4 and λ is a wavelength, the point spread function range is represented as a circle having a radius of 0.61λ/NA on the image surface and takes a value divided by a magnification of the image formation optical system 4 on the phase shifter (the light modulation element) 1.

In the modification of FIG. 14, a second phase area (indicated by a shaded portion in the drawing) 11b having a phase value of +90° with respect to the first phase area 11a or a third phase area (indicated by a shaded portion in the drawing) 11c having a phase value of −90° with respect to the first phase area 11a is formed in each cell 11d comprising a first phase area (indicated by a blank portion in the drawing) 11a having a phase value of, e.g., zero (a reference phase value). Specifically, the second phase areas 11b are formed in all the cells on the right side in the drawing, and the third phase areas 11c are formed in all the cells on the left side in the drawing. Further, each of an area share ratio of the second phase area 11b and an area share ratio of the third phase area 11c in each cell is 50%.

In this case, in the area on the right side in the drawing, a vectorial average value of phase modulation quantities in the point spread function range 4d of the image formation optical system 4 is +45° based on the following Expression (6). On the other hand, a vectorial average value of phase modulation quantities in the point spread function range 4d of the image formation optical system 4 is −45° based on the following Expression (7). Therefore, a phase step having a phase difference of 90° is formed along a boundary 31 between the area on the right side in the drawing and the area on the left side in the drawing based on a difference in vectorial average value of the phase modulation quantities, i.e., a difference between +45° and −45°.

$$0.5 \times e^{i0} + 0.5 \times e^{i(\pi/2)} = 0.5 \times 2^{1/2} \times e^{i(\pi/4)} \quad (6)$$

$$0.5 \times e^{i0} + 0.5 \times e^{i(-\pi/2)} = 0.5 \times 2^{1/2} \times e^{i(-\pi/4)} \quad (7)$$

As a result, the same effect as the foregoing embodiment in which the phase shifter 1 is obliquely illuminated can be obtained by obliquely illuminating the light modulation element having the phase pattern according to the modification of FIG. 14. It is to be noted that the vectorial average value of phase modulation quantities in the point spread function range 4d of the image formation optical system 4, i.e., an average phase value Pav is defined by the following Expression (8). It is to be noted that arg is a function required to obtain a phase value, x, y is a coordinate on the phase pattern surface and θ is a phase at a given point on the phase pattern surface in Expression (8).

$$Pav = arg(\int e^{i\theta(x,y)} dx dy) \quad (8)$$

A description will now be given as to a method of manufacturing an electronic device in an area crystallized by using the crystallization apparatus according to this embodiment with reference to FIGS. 15A to 15E.

Figure 15A:
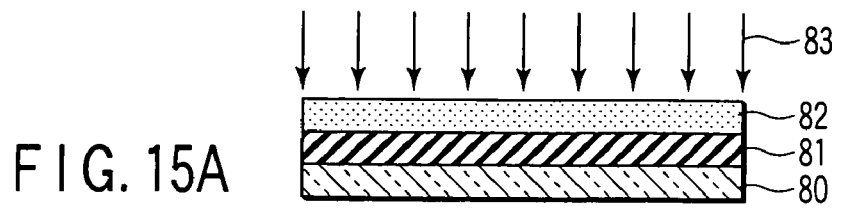
FIGS. 15A to 15E are process cross-sectional views showing processes of manufacturing an electronic device by using a crystallization apparatus according to the mode.

As shown in FIG. 15A, there is prepared a processed substrate 5 which is obtained by forming an underlying film 81 (e.g., a laminated film of SiN film having a thickness of 50 nm and SiO$_2$ film having a thickness of 100 nm), an amorphous semiconductor film 82 (e.g., Si, Ge or SiGe having a film thickness of approximately 50 to 200 nm) and a cap film 82 (e.g., an SiO$_2$ film having a film thickness of 30 to 300 nm) on an insulating substrate 80 (e.g., alkali glass, quartz glass, plastic or polyimide) by using a chemical vapor deposition method or a sputtering method. Then, a predetermined area in an upper surface of the amorphous semiconductor film 82 is irradiated with a laser light beam 83 (e.g., a KrF excimer laser light or an XeCl excimer laser light) by using the crystallization apparatus according to this embodiment.

Figure 15B:
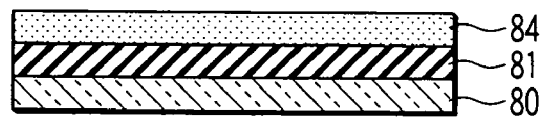
Figure 15C:
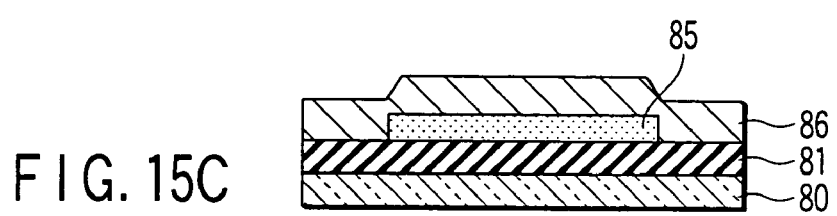
Figure 15D:
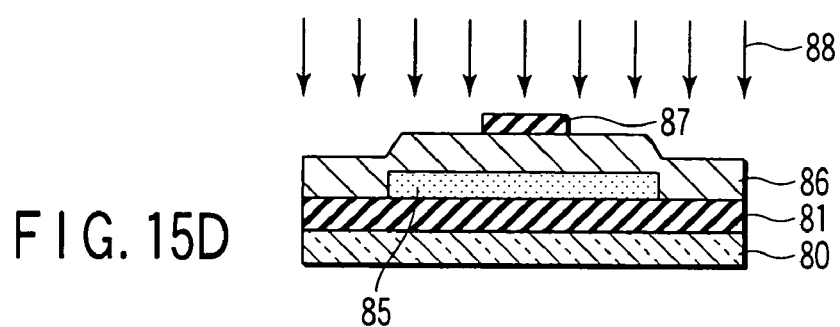
Figure 15E:
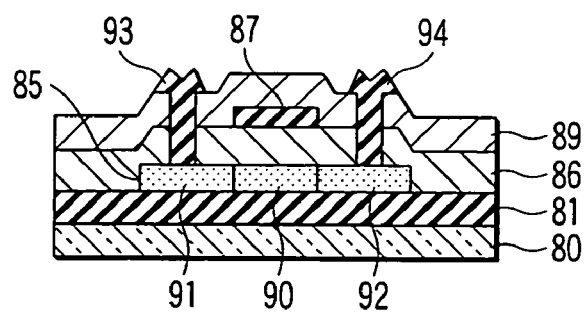
Figure 16A:
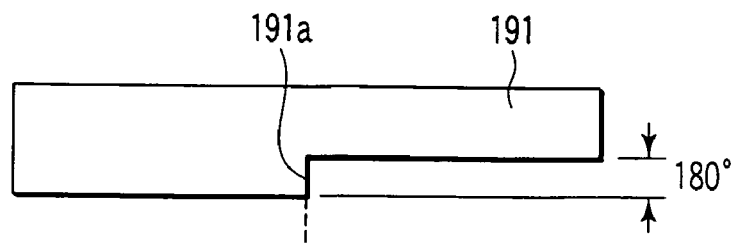
FIGS. 16A to 16D are views illustrating light intensity distributions with an inverse peak shape formed through an image formation optical system when a phase shifter having a phase difference of 180° is used.
Figure 16B:
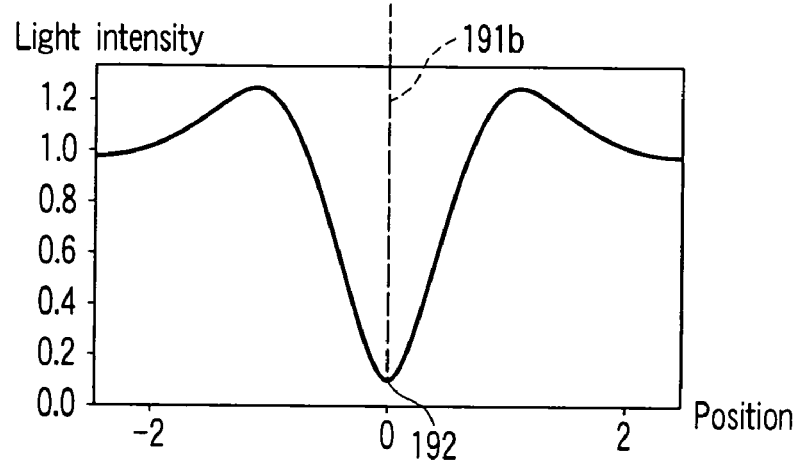
Figure 16C:
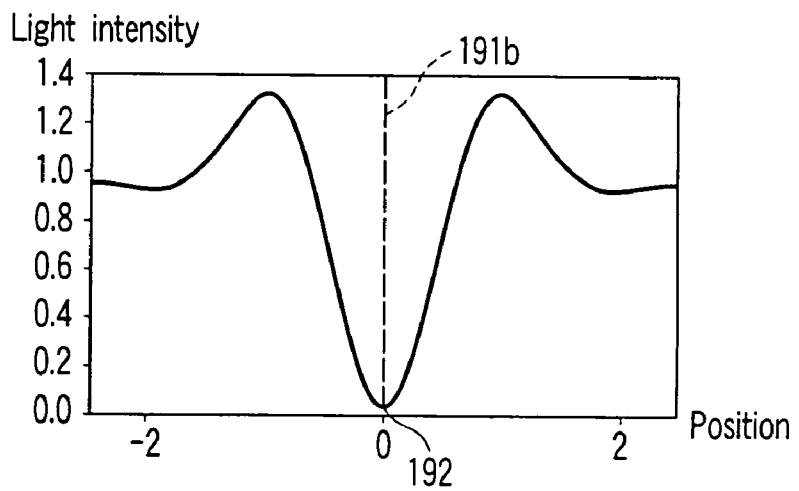
Figure 16D:
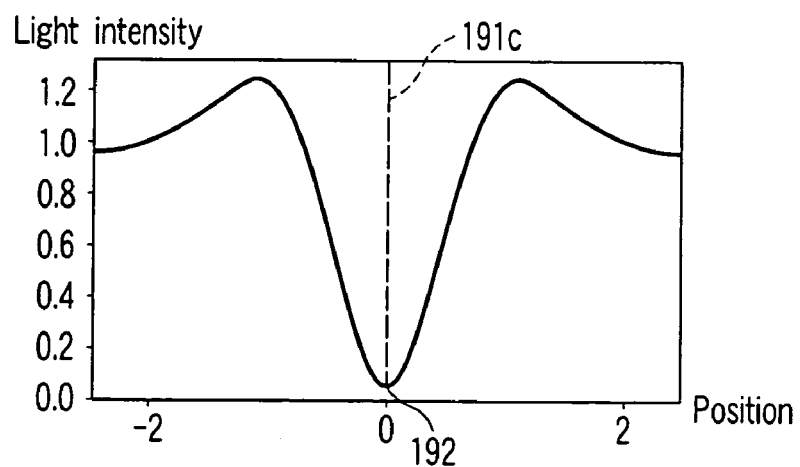

In this manner, as shown in FIG. 15B, a polycrystal semiconductor film or a single-crystallized semiconductor film 84 having a crystal of a large grain size is formed. Then, after the cap film 82 is removed by etching, as shown in FIG. 15C, the polycrystal semiconductor film or the single-crystallized semiconductor film 84 is processed into an island-shaped semiconductor film 85 which becomes an area in which, e.g., a thin film transistor is formed by using a photolithography technique, and an SiO$_2$ film having a thickness of 20 to 100 nm is formed as a gate insulating film 86 on the surface of the semiconductor film 85 by using the chemical vapor deposition method or the sputtering method. Furthermore, as shown in FIG. 15D, a gate electrode 87 (e.g., silicide or MoW) is formed on the gate insulating film 86, and impurity ions 88 (phosphor in the case of an N-channel transistor, and boron in the case of a P-channel transistor) are implanted with the gate electrode 87 being used as a mask. Thereafter, annealing processing (e.g., one hour at 450° C.) is carried out in a nitrogen atmosphere in order to activate the impurities, so that a source area 91 and a drain area 92 are formed on the island-shaped semiconductor film 85. Then, as shown in FIG. 15E, an interlayer insulating film 89 is formed, contact holes are formed therethrough, and a source electrode 93 and a drain electrode 94 electrically connected to a source region 91 and a drain region 92 between which a channel 90 is defined.

In the above-described processes, the channel 90 is formed in accordance with a position of a crystal having a large grain size of the polycrystal semiconductor film or the single-crystallized semiconductor film 84 formed in the processes shown in FIGS. 15A and 15B. With the above-described processes, it is possible to form a polycrystal transistor or a thin-film transistor (TFT) in the single-crystallized semiconductor. The thus manufactured polycrystal transistor or single-crystallized transistor can be applied to a drive circuit for a liquid crystal display unit (display) or an electroluminescent display or an integrated circuit for, e.g., a memory (an SRAM or a DRAM) or a CPU.

In the above description, the present invention is applied to the crystallization apparatus and the crystallization method which generate a crystallized semiconductor film by irradiating a non-single-crystal semiconductor film with light having a predetermined light intensity. However, the present invention is not restricted thereto, and the present invention can be generally applied to a light irradiation apparatus which forms a predetermined light intensity distribution on a predetermined surface through an image formation optical system.

Also, the phase shifter and the wedge-shaped prism may be so arranged that they are apart in a predetermined distance or contact with each other. Further, if one surface, for example, light incident surface of the phase shifter is formed to be angled with the other surface, for example light emitting surface at a predetermined angle, it is not necessary to use the wedge-shaped prism.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A light irradiation apparatus comprising:
   a light modulation element which has a phase step having a phase difference substantially different from 180°;
   an illumination optical system which illuminates the light modulation element; and
   an image formation optical system which forms, on an irradiation surface, a light intensity distribution based on a light beam phase-modulated by the light modulation element,
   wherein the illumination optical system illuminates the light modulation element with an illumination light beam inclined in a direction normal to a step line of the phase step.

2. The light irradiation apparatus according to claim 1, wherein the light modulation element has a phase step having a phase difference substantially smaller than 180°, and the illumination optical system illuminates the light modulation element along a direction including a component orientated from a phase delay side toward a phase advance side of the phase step.

3. The light irradiation apparatus according to claim 1, wherein the light modulation element has a phase step having a phase difference substantially larger than 180°, and the illumination optical system illuminates the light modulation element along a direction including a component orientated from a phase advance side toward a phase delay side of the phase step.

4. The light irradiation apparatus according to claim 1, wherein the illumination optical system has a wedge-shaped prism which is arranged on a light incidence side of the light modulation element.

5. The light irradiation apparatus according to claim 1, wherein the illumination optical system has an aperture diaphragm arranged at or in the vicinity of an exit pupil, and an aperture portion of the aperture diaphragm is deviated with respect to an optical axis of the illumination optical system.

6. The light irradiation apparatus according to claim 1, wherein the light modulation element has a phase modulation pattern which is used to form a light intensity distribution in which an intensity varies along a direction of the step line of the phase step.

7. The light irradiation apparatus according to claim 1, wherein the phase step is formed based on a difference in vectorial average value of phase modulation quantities in a point spread function range of the image formation optical system.

* * * * *